United States Patent
Ohtani

(10) Patent No.: US 6,717,844 B1
(45) Date of Patent: Apr. 6, 2004

(54) SEMICONDUCTOR MEMORY DEVICE WITH LATCH CIRCUIT AND TWO MAGNETO-RESISTANCE ELEMENTS

(75) Inventor: Jun Ohtani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/334,002

(22) Filed: Dec. 31, 2002

(30) Foreign Application Priority Data

Sep. 12, 2002 (JP) .......................... 2002-266379

(51) Int. Cl.[7] .............................. G11C 11/00
(52) U.S. Cl. .................. 365/158; 365/50; 365/154; 365/171
(58) Field of Search .................. 365/50, 158, 171, 365/173, 154, 55, 66

(56) References Cited

U.S. PATENT DOCUMENTS 6,304,477 B1 * 10/2001 Naji ............................ 365/50

6,515,895 B2 * 2/2003 Naji ............................ 365/171

FOREIGN PATENT DOCUMENTS

JP         2002-511631        4/2002

* cited by examiner

*Primary Examiner*—Gene Auduong
(74) *Attorney, Agent, or Firm*—Burns, Doane, Swecker & Mathis, L.L.P.

(57) ABSTRACT

A memory cell in a MRAM includes four N channel MOS transistors responsive to a write permit signal attaining an H level to connect program lines of first and second tunneling magneto-resistance elements between first and second storage nodes and a line of ground potential to write signals in the first and second storage nodes to the first and second tunneling magneto-resistance elements. The writing of signals to first and second tunneling magneto-resistance elements can be performed more rapidly than the conventional case where signals in the first and second storage nodes are read out, and then written into the tunneling magneto-resistance elements via a write circuit and a write bit line pair.

4 Claims, 7 Drawing Sheets

SEMICONDUCTOR MEMORY DEVICE WITH LATCH CIRCUIT AND TWO MAGNETO-RESISTANCE ELEMENTS

BACKGROUND OF THE INVENTION

1. Field of the Invention

The present invention relates to semiconductor memory devices, particularly to a semiconductor memory device including a latch circuit and two magneto-resistance elements.

2. Description of the Background Art

As a memory of low power consumption that can store data in a non-volatile manner, a MRAM (Magnetic Random Access Memory) employing a magneto-resistance element is now attracting attention. FIG. 7 is a circuit block diagram showing a structure of a memory cell 51 in a conventional MRAM. Such a memory cell 51 is disclosed in, for example, U.S. Pat. No. 6,304,477.

Referring to FIG. 7, memory cell 51 is arranged at the crossing of a word line WL and a digit line DL, and a bit line pair BL, ZBL and a write bit line pair WBL, ZBL. Memory cell 51 includes P channel MOS transistors 52 and 53, N channel MOS transistors 54–59, and tunneling magneto-resistance elements 13 and 14.

N channel MOS transistor 54 is connected between bit line BL and a node N51, and has its gate connected to word line WL. N channel MOS transistor 55 is connected between bit line ZBL and a node N52, and has its gate connected to word line WL. P channel MOS transistors 52 and 53 are connected between the line of power supply potential VDD and storage nodes N51 and N52, respectively, and have their gates connected to nodes N52 and N51, respectively. N channel MOS transistors 56 and 57 have their drains connected to storage nodes N51 and N52, respectively, and their gates connected to storage nodes N52 and N51, respectively. N channel MOS transistors 58 and 59 have their drains connected to the sources of N channel MOS transistors 56 and 57, respectively, and their sources connected to the electrodes at the back face of tunneling magneto-resistance elements 60 and 61, respectively. Both the gates of N channel MOS transistors 58 and 59 receive a signal EN. Program lines PL and ZPL at the front face of tunneling magneto-resistance elements 60 and 61 are connected to write bit lines WBL and ZWBL, respectively. Digit line DL is disposed in the proximity of the back face of tunneling magneto-resistance elements 60 and 61.

When signal EN is driven to an H level (logical high) to render N channel MOS transistors 58 and 59 conductive and write bit lines WBL and ZWBL are pulled down to an L level (logical low), memory cell 51 attains a configuration identical to that of a memory cell of a SRAM (Static Random Access Memory). Storage nodes N51 and N52 store signals complementary to each other. These signals attain either one of an H level and an L level (binary). For example, storage nodes N51 and N52 retain an H level and an L level, respectively, to store data "1". Storage nodes N51 and N52 retain an L level and an H level, respectively, to store data "0". The write/read operation of signals of storage nodes N51 and N52 is carried out in a manner identical to that of a general SRAM.

In the case where signals of storage nodes N51 and N52 are to be written into tunneling magneto-resistance elements 60 and 61, the signals of storage nodes N51 and N52 are first temporarily read out to an external source via bit line pair BL and ZBL. Then, a predetermined current is conducted to digit line DL and write bit lines WBL and ZWBL using a dedicated write circuit, whereby signals are written into tunneling magneto-resistance elements 60 and 61. Each resistance value of tunneling magneto-resistance elements 60 and 61 depends upon the logic level of the written signal, and does not change even if power supply voltage VDD is cut off.

In the case where power supply potential VDD is cut off and applied again, the drive of signal EN to an H level causes write bit lines WBL and ZWBL to go low. Accordingly, the difference in the resistance between tunneling magneto-resistance elements 60 and 61 causes difference in the current drivability of pulling down storage nodes N51 and N52 to an L level. A signal of a logic level corresponding to the difference is read out to storage nodes N1 and N2. Thus, this MRAM operates as a non-volatile memory.

In the case where the signals of storage nodes N51 and N52 are to be written into tunneling magneto-resistance elements 60 and 61 in a conventional MRAM, the signals of storage nodes N51 and N52 had to be first read out to an external source and then written using a dedicated write circuit and write bit lines WBL and ZWBL. There was a problem that signal writing is time-consuming. There was also the problem that the layout area is increased by the provision of the dedicated write circuit and write bit lines WBL and ZWBL.

SUMMARY OF THE INVENTION

In view of the foregoing, an object of the present invention is to provide a semiconductor memory device of a small layout area that can write a signal in a storage node into a magneto-resistance element rapidly.

According to an aspect of the present invention, a semiconductor memory device includes first and second magneto-resistance elements. Each magneto-resistance element includes a magnetic material film, and a program line and an electrode formed at the front face and back face, respectively, of the magnetic material film. In response to a current exceeding a predetermined threshold current being conducted to the program line, the resistance value across the program line and electrode is altered. A binary signal is stored by that resistance value. The semiconductor memory device also includes a first inverter driven by a power supply voltage applied via the program line and electrode of the second magneto-resistance element to provide an inverted signal of the signal applied to a first storage node to a second storage node, a second inverter driven by a power supply voltage applied via the program line and electrode of the first magneto-resistance element to provide an inverted signal of the signal applied to the second storage node to the first storage node, and a first switching circuit responding to a write permit signal permitting writing of the signals in the first and second storage nodes to the first and second magneto-resistance elements to connect the program lines of the first and second magneto-resistance elements between the first and second storage nodes, respectively, and the line of a reference potential. Since the signal in a storage node is directly written into a magneto-resistance element, writing of a signal in a storage node to a magneto-resistance element can be carried out more rapidly than in the conventional case where the signal in the storage node is first read out to an external source and then written into a magneto-resistance element through a write circuit and write bit lines. Furthermore, the layout area can be reduced since it is not necessary to provide a write circuit and write bit lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
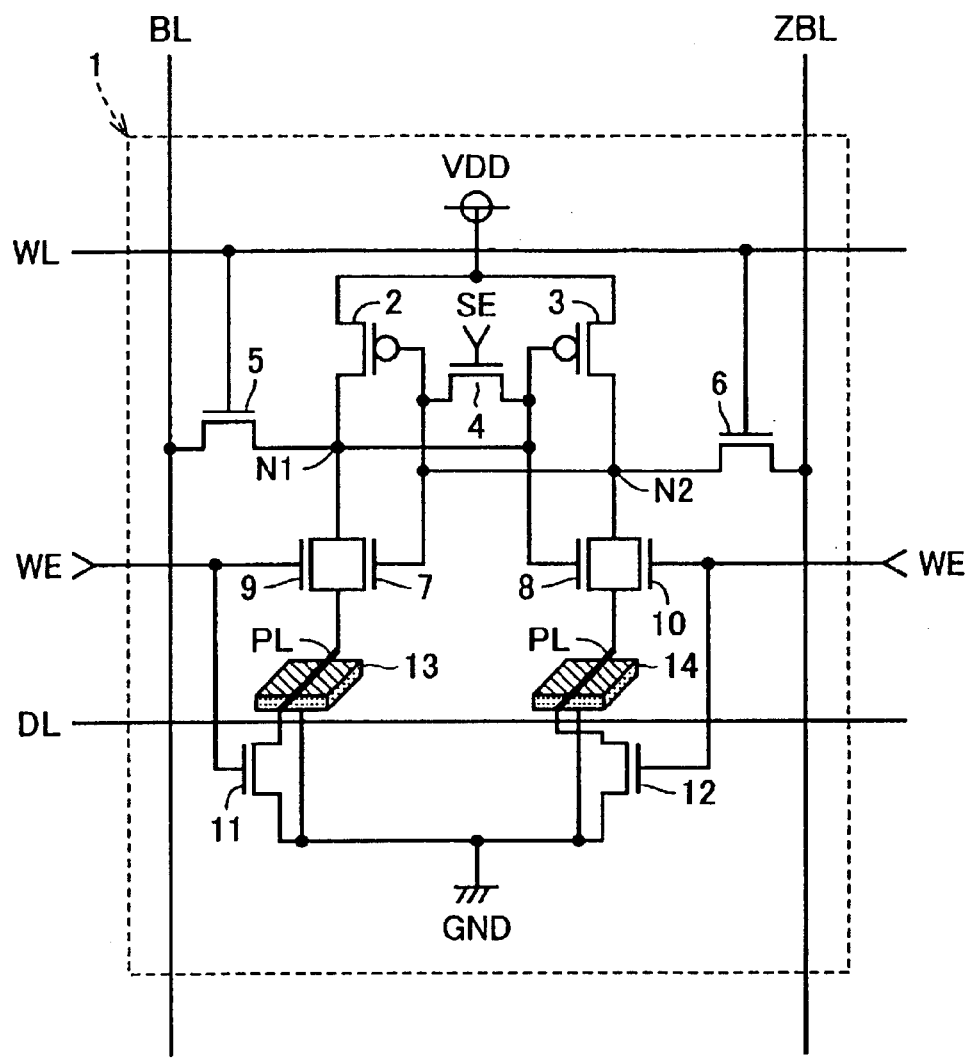
FIG. 1 is a circuit block diagram showing a structure of a memory cell in a MRAM according to an embodiment of the present invention.

FIG. 1 is a circuit block diagram showing a structure of a memory cell 1 of a MRAM according to an embodiment of the present invention. Referring to FIG. 1, memory cell 1 is disposed at the crossing of a word line WL and a digit line DL, and bit line pair BL and ZBL. Memory cell 1 includes P channel MOS transistors 2 and 3, N channel MOS transistors 4–12, and tunneling magneto-resistance elements 13 and 14.

Figure 2:
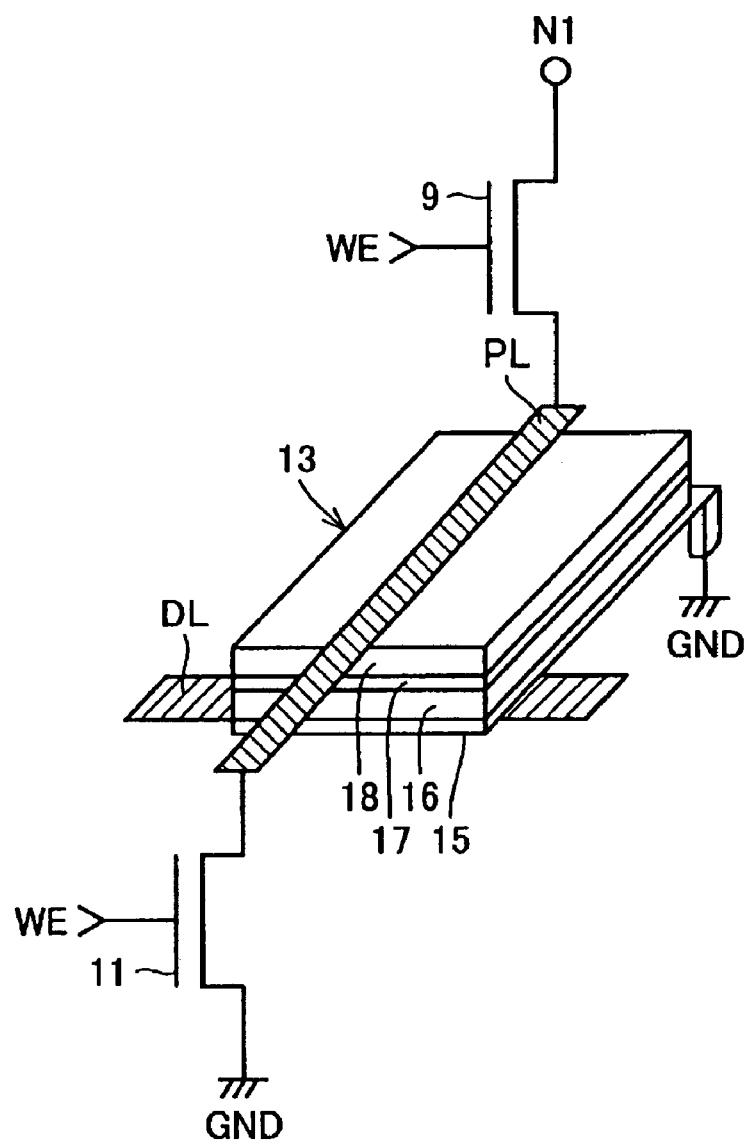
FIG. 2 is a circuit block diagram of a structure of a tunneling magneto-resistance element shown in FIG. 1.

As shown in FIG. 2, tunneling magneto-resistance element 13 includes an electrode 15, a fixed magnetic layer 16, a tunneling barrier layer 17, and a free magnetic layer 18 sequentially layered on the surface of electrode 15, and a program line PL formed at the surface of free magnetic layer 18. Fixed magnetic layer 16 is a ferromagnetic material layer having a fixed constant magnetizing direction. Tunneling barrier layer 17 is formed of an insulator film. Free magnetic layer 18 is a ferromagnetic material layer magnetized in a direction according to an externally applied magnetic field. A magnetic tunnel junction is formed by these fixed magnetic layer 16, tunneling barrier layer 17, and free magnetic layer 18. A digit line DL is disposed underneath electrode 15. Digit line DL and program line PL extend in a direction orthogonal to each other.

Free magnetic layer 18 is magnetized in a direction identical to or opposite to fixed magnetic layer 16 according to the logic level of the write data signal. The electric resistance value between program line PL and electrode 15 attains the smallest value and the largest value when the magnetizing directions of free magnetic layer 18 and fixed magnetic layer 16 are identical and opposite, respectively.

Here, it is assumed that the magnetizing directions of free magnetic layer 18 and fixed magnetic layer 16 are identical by applying a high magnetic field at the time of fabrication of tunneling magneto-resistance elements 13 and 14. When a predetermined current is conducted to digit line DL and a current exceeding a predetermined threshold current is conducted to program line PL, the magnetizing direction of free magnetic layer 18 is reversed, whereby the resistance across program line PL and electrode 15 increases. It is to be noted that the threshold current required to reverse the magnetizing direction of free magnetic layer 18 becomes smaller as the current conducted to digit line DL becomes larger. Tunneling magneto-resistance element 14 has a structure identical to that of tunneling magneto-resistance element 13.

Referring to FIG. 1 again, P channel MOS transistors 2 and 3 are connected between the line of power supply potential VDD and storage nodes N1 and N2, respectively, and have their gates connected to storage nodes N2 and N1, respectively. N channel MOS transistor 7 is connected between storage node N1 and one end of the program line of tunnel tunneling magneto-resistance element 13, and has its gate connected to a storage node N2. N channel MOS transistor 8 is connected between storage node N2 and the other end of program line PL of tunneling magneto-resistance element 14, and has its gate connected to storage node N1. The electrodes of tunneling magneto-resistance elements 13 and 14 are both connected to the line of ground potential GND. Each resistance value of tunneling magneto-resistance elements 13 and 14 is 30 k–60 kΩ. This resistance value is low enough to retain storage node N1 or N2 at an L level. N channel MOS transistor 5 is connected between this line BL and storage node N1, and has its gate connected to word line WL. N channel MOS transistor 6 is connected between bit line ZBL and storage node N2, and has its gate connected to word line WL. These elements 2, 3, 5–8, 13 and 14 form the memory cell of a SRAM.

P channel MOS transistor 3 and N channel MOS transistor 8 form a first inverter that provides an inverted signal of the signal applied to storage node N1 to storage node N2. P channel MOS transistor 2 and N channel MOS transistor 7 form a second inverter that provides to node N1 an inverted signal of the signal applied to storage node N2. The first and second inverters form a latch circuit. Storage nodes N1 and N2 latch signals complementary to each other. For example, the latching of an H level and an L level at storage nodes N1 and N2, respectively, corresponds to the storage of data "1". The latching of an L level and an H level in storage nodes N1 and N2, respectively, corresponds to the storage of data "0".

N channel MOS transistors 9 and 10 are connected in parallel to N channel MOS transistors 7 and 8, respectively, and receive a write permit signal WE at their gates. N channel MOS transistors 11 and 12 are connected between the other end of program line PL of tunneling magneto-resistance elements 13 and 14, respectively, and the line of ground potential GND, and receive write permit signal WE at their gates.

When signal WE attains an H level of activation, N channel MOS transistors 9 and 12 conduct. A large current flows to the line of ground potential GND from one of storage nodes N1 and N2 attaining an H level (for example node N1) through N channel MOS transistor 9, program line PL of tunneling magneto-resistance element 13, and N channel MOS transistor 11. The magnetizing direction of free magnetic layer 18 of tunneling magneto-resistance element 13 is reversed, whereby the resistance of tunneling magneto-resistance element 13 increases.

N channel MOS transistor 4 is connected between storage nodes N1 and N2, and receives signal SE at its gate. Signal SE goes high when power is turned on, and is gradually pulled down to an L level. Accordingly, the signals in tunneling magneto-resistance elements 13 and 14 can be read out stably into storage nodes N1 and N2.

The operation of memory cell 1 will be described here. Elements 2, 3, 5–8, 13, and 14 form a memory cell of a general SRAM. Therefore, writing a data signal into storage nodes N1 and N2 is performed in a manner similar to that of a general SRAM.

Specifically, signals SE and WE are driven to an L level, and digit line DL goes low. Then, word line WL is driven to the selected level of H. According to the write data signal, one of bit lines BL and ZBL (for example bit line BL) is driven to an H level and the other bit line (in this case, bit line ZBL) is driven to an L level. Accordingly, N channel MOS transistors 5 and 6 are rendered conductive, and the potentials of bit lines BL and ZBL are latched in storage nodes N1 and N2, respectively, by MOS transistors 2, 3, 7, and 8. By driving word line WL to the non-selected level of L, data is stored in storage nodes N1 and N2.

In the case where the data in storage nodes N1 and N2 are to be written into tunneling magneto-resistance elements 13 and 14, signals SE and WE are pulled down to an L level. Also, word line WL is pulled down to an L level. A predetermined current is conducted to digit line DL to apply an auxiliary magnetic field in the hard magnetizing direction. Then, signal WE is pulled up to an H level to render N channel MOS transistors 9–12 conductive.

In the case where storage nodes N1 and N2 latch an H level and an L level, respectively, current flows from the line of a power supply potential VDD to the line of ground potential GND via P channel MOS transistor 2, storage node N1, N channel MOS transistor 9, program line PL at the surface of tunneling magneto-resistance element 13, and N channel MOS transistor 11. By this current, a magnetic field in the easy magnetizing direction is generated to reverse the magnetizing direction of free magnetic layer 18 of tunneling magneto-resistance element 13. As a result, the resistance of tunneling magneto-resistance element 13 is increased.

In the case where storage nodes N1 and N2 latch an L level and an H level, respectively, current flows from the line of power supply potential VDD to the line of ground potential GND via P channel MOS transistor 3, storage node N2, N channel MOS transistor 10, program line PL at the surface of tunneling magneto-resistance element 14, and N channel MOS transistor 12. By this current, a magnetic field in the easy magnetizing direction is generated to reverse the magnetizing direction of free magnetic layer 18 of tunneling magneto-resistance element 14. As a result, the resistance of tunneling magneto-resistance element 14 increases. Upon signal WE going low, the data transfer from storage nodes N1 and N2 to tunneling magneto-resistance elements 13 and 14 ends.

When the magnetizing direction of free magnetic layer 18 is reversed, the resistance of tunneling magneto-resistance element 13 or 14 becomes higher by approximately 20%. However, this does not affect the retention of the level at storage nodes N1 and N2. Therefore, reading out signals from storage nodes N1 and N2 is carried out in a manner similar to that of a general SRAM.

Specifically, signals SE and WE are pulled down to an L level. Digit line DL is also pulled down to an L level. Following the charge of each bit lines BL and ZBL to an H level, word line WL is pulled up to the selected level of H to render N channel MOS transistors 5 and 6 conductive.

In the case where storage nodes N1 and N2 are at an H level and an L level, respectively, current flows from bit line ZBL to the line of ground potential GND via N channel MOS transistors 6 and 8 and tunneling magneto-resistance element 14. As a result, the potential of bit line ZBL becomes lower.

In the case where storage nodes N1 and N2 are at an L level and an H level, respectively, current flows from bit line BL to the line of ground potential GND via N channel MOS transistors 5 and 7 and tunneling magneto-resistance element 13. As a result, the potential of bit line BL becomes lower. Therefore, by comparing the potentials of bit lines BL and ZBL, the signals of storage nodes N1 and N2 can be read out.

Although the cut off of power supply voltage VDD will pull down storage nodes N1 and N2 to both an L level to result in the loss of the signals in storage nodes N1 and N2, the magnetizing directions of tunneling magneto-resistance elements 13 and 14 do not change. In the case where power supply voltage VDD is cut off and power is turned on again, the signals stored in tunneling magneto-resistance elements 13 and 14 are read out to storage nodes N1 and N2 by the procedure set forth below.

Signal SE is pulled up to an H level to render N channel MOS transistor 4 conductive. The potentials of storage nodes N1 and N2 are equalized. Then, signal SE is gradually pulled down from an H level to an L level. At this stage, the difference in the resistances between tunneling magneto-resistance elements 13 and 14 (6 k–12 kΩ) causes difference in the current drivability of pulling down storage nodes N1 and N2 to an L level. This difference in the current drivability is sensed and amplified.

In the case where the resistance value of tunneling magneto-resistance element 13 is higher than the resistance value of tunneling magneto-resistance element 14, storage nodes N1 and N2 attain an H level and an L level, respectively. In the case where the resistance value of tunneling magneto-resistance element 14 is higher than the resistance value of tunneling magneto-resistance element 13, storage nodes N1 and N2 attain an L level and an H level, respectively. This relationship matches the relationship between the potentials of storage nodes N1 and N2 and the resistance values of tunneling magneto-resistance elements 13 and 14 when the signals in storage nodes N1 and N2 are written into tunneling magneto-resistance elements 13 and 14. Therefore, this MRAM functions as a non-volatile memory.

Figure 3:
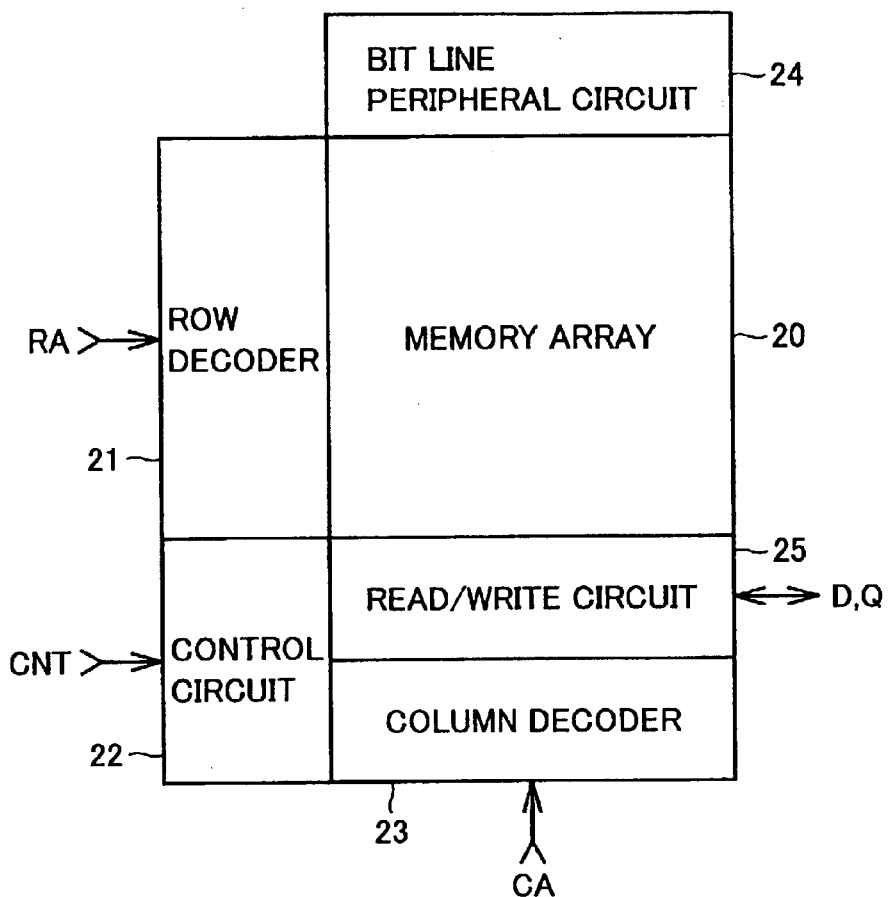
FIG. 3 is a block diagram showing an entire structure of a MRAM including the memory cell shown in FIG. 1.

FIG. 3 is a block diagram of the entire structure of a MRAM employing memory cell 1 shown in FIGS. 1 and 2. Referring to FIG. 3, this MRAM includes a memory array 20, a row decoder 21, a control circuit 22, a column decoder 23, a bit line peripheral circuit 24, and a read/write circuit 25.

Figure 4:
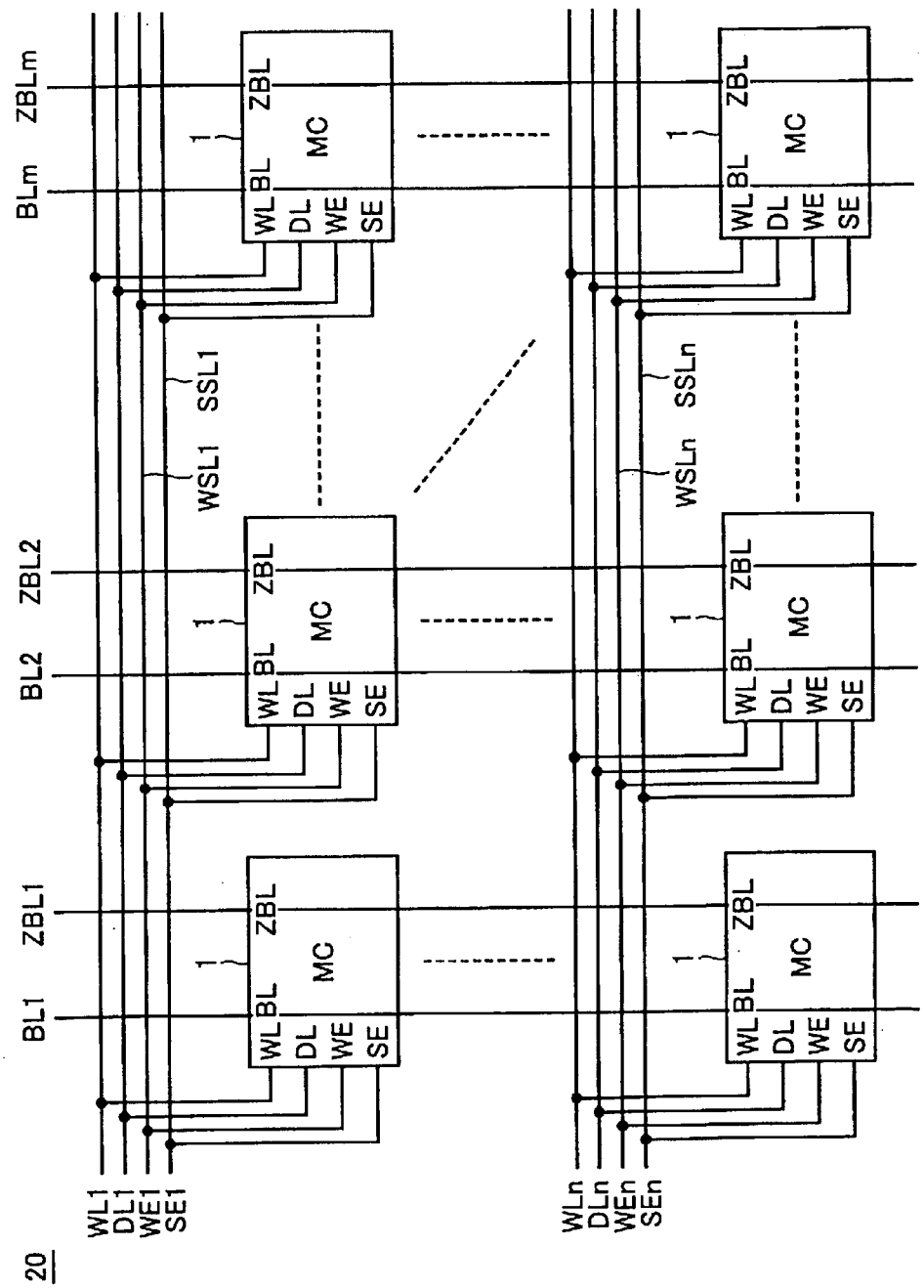
FIG. 4 is a block diagram of a structure of the memory array shown in FIG. 3.

Referring to FIG. 4, memory array 20 includes n×m memory cells 1 arranged in n rows and m columns (where each of n and m is an integer of at least 2), n word lines WL1–WLn provided corresponding to the n rows, respectively, digit lines DL1–DLn provided corresponding to the n rows, respectively, n signal lines WSL1–WSLn provided corresponding to the n rows, respectively, n signal lines SSL1–SSLn provided corresponding to the n rows, respectively, and m bit line pairs BL1, ZBL–BLm, ZBLm provided corresponding to the m columns, respectively. Each memory cell 1 is connected to word line WL, digit line DL, and signal lines WSL, SSL of the corresponding row, as well as to bit lines BL and ZBL of the corresponding column.

As shown in FIGS. 1 and 2, each of digit lines DL1–DLn passes the neighborhood at the back face of tunneling magneto-resistance elements 13 and 14 of each memory cell 1 of the corresponding row. Digit lines DL1–DLn each have one end connected to row decoder 21 and the other end connected to ground directly or via a resistance element or the like that has a predetermined resistance value.

Referring to FIG. 3 again, row decoder 21 responds to a row address signal RA and an internal control signal from control circuit 22 to drive word line WL, digit line DL and signal lines WSL, SSL. Specifically, row decoder 21 in a normal write/read operation mode selects any of the n word lines WL1–WLn according to row address signal RA and drives that word line WL to the selected level of H to render active each memory cell 1 corresponding to that selected word line WL.

In the case where the signals in storage nodes N1 and N2 are to be written into tunneling magneto-resistance elements 13 and 14, row decoder 21 conducts a predetermined current to each digit line DL. In the case where the data signals of tunneling magneto-resistance elements 13 and 14 are to be read out to storage nodes N1 and N2 when power is turned on, row decoder 21 provides signal SE to each memory cell 1 of the relevant row via signal line SSL. Signal SE attains an H level in response to the application of power supply potential VDD, and is then gradually pulled down from the H level to an L level.

Control circuit 22 generates various internal control signals /BLEQ, WE, SE, . . . , according to an external control signal CNT to provide entire control of the MRAM according to the generated internal control signals /BLEQ, WE, SE, . . . . Column decoder 23 selects any of the m column select lines CSL1–CSLm that will be described afterwards according to a column address signal CA. That column select line CSL is pulled up to an H level corresponding to the selected level.

Figure 5:
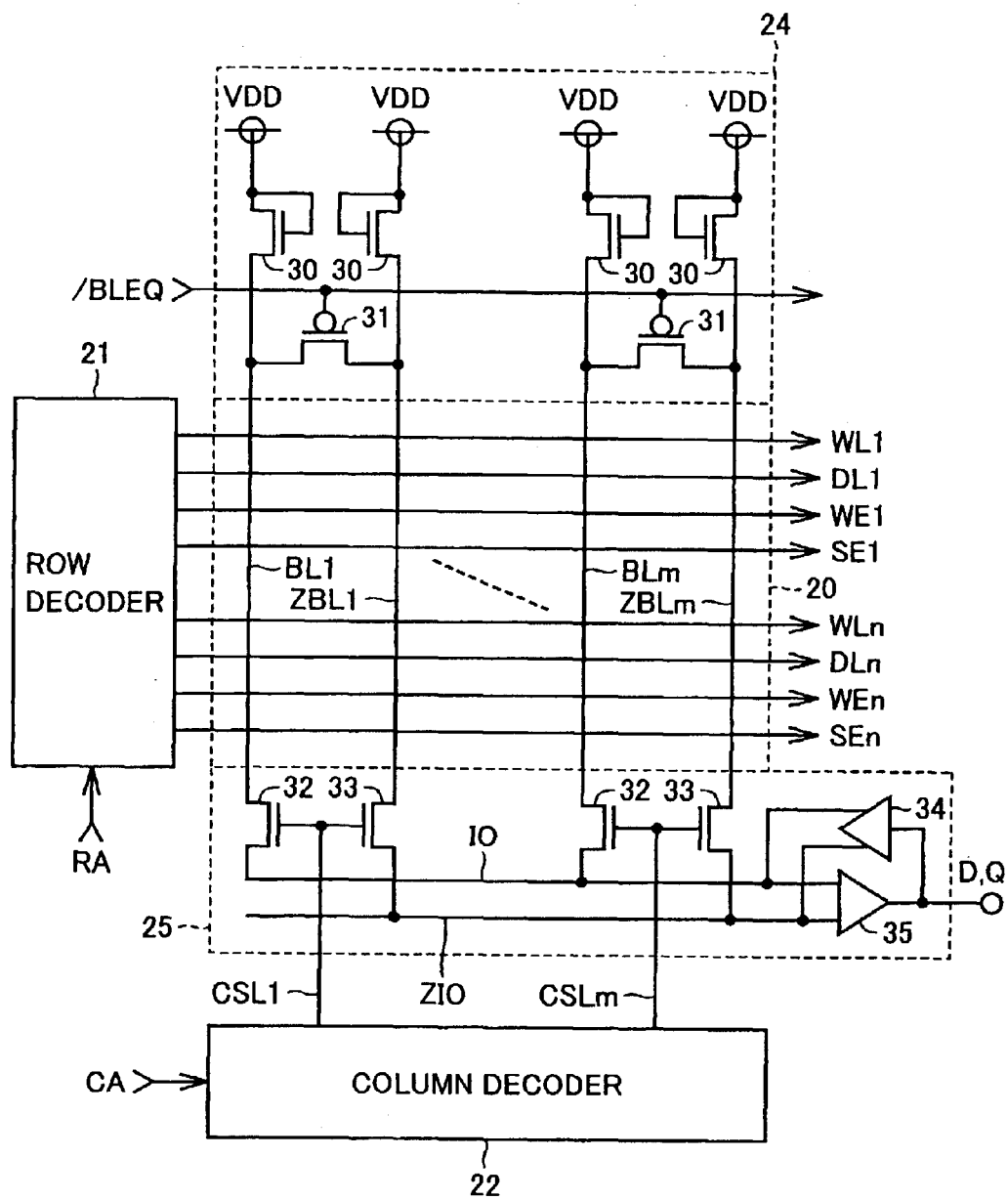
FIG. 5 is a circuit block diagram of a structure of a bit line peripheral circuit and a read/write circuit shown in FIG. 3.

Referring to FIG. 5, bit line peripheral circuit 24 includes a bit line load 30 provided corresponding to each bit line BL or ZBL, and an equalizer 31 provided corresponding to each bit line pair BL and ZBL. Bit line load 30 includes a diode-connected N channel MOS transistor between the line of power supply potential VDD and one end of the corresponding bit line BL or ZBL to charge the corresponding bit line BL and or ZBL to an H level. Equalizer 31 includes a P channel MOS transistor connected between corresponding bit line pair BL and ZBL, receiving bit line equalize signal /BLEQ at its gate. When bit line equalize signal /BLEQ attains an activation level of L, the P channel MOS transistor is rendered conductive, whereby the potentials of bit lines BL and ZBL are equalized.

Read/write circuit 25 includes data input/output line pair IO and ZIO, N channel MOS transistors 32 and 33 provided corresponding to each bit line pair BL, ZBL, a write circuit 34, and a read circuit 35. N channel MOS transistor 32 is connected between the other end of the corresponding bit line BL and one end of data input/output line 10, and have its gate connected to a corresponding column select line CSL. N channel MOS transistor 33 is connected between the other end of the corresponding bit line ZBL and one end of data input/output line ZIO, and has its gate connected to a corresponding column select line CSL. Write circuit 34 and read circuit 35 are both connected to the other end of data input/output line pair IO and ZIO. Write circuit 34 writes externally applied data into memory cell 1 selected by row decoder 21 and column decoder 22. Read circuit 35 outputs the data read out from memory cell 1 selected by row decoder 21 and column decoder 22.

The operation of the MRAM shown in FIGS. 3–5 will be described here. In a normal write operation mode, word line WL1, for example, is pulled up to the select level of "H" by row decoder 21, whereby m memory cells 1 corresponding to that word line WL are rendered active. Then, column select line CSL1, for example, is pulled up to the selected level of H by column decoder 22, whereby N channel MOS transistors 32 and 33 of that column are rendered conductive. Memory cell 1 rendered active is connected to write circuit 34 via bit line pair BL1, ZBL1 and data input/output line pair IO, ZIO.

According to externally applied data, write circuit 34 pulls up one of data input/output lines IO and ZIO to an H level and the other of data input/output lines IO and ZIO to an L level to write data into memory cell 1. When word line WL1 and column select line CSL1 is pulled down to an L level, data is stored in one memory cell 1.

In a normal read operation mode, column select line CSL1, for example, is pulled up to the selected level of H by column decoder 22, whereby N channel MOS transistors 32 and 33 of that column are rendered conductive. Bit line pair BL1, ZBL1 is connected to read circuit 35 via data input/output line pair IO, ZIO. Then, bit line equalize signal /BLEQ is pulled down to an L level of activation. Each equalizer 31 is rendered conductive, whereby the potentials of bit lines BL and ZBL are equalized. Following the drive of bit line equalize signal /BLEQ to an H level of inactivation to render equalizer 31 non-conductive, word line WL1, for example, is pulled up to the selected level of H by column decoder 21. As a result, m memory cells 1 corresponding to that word line WL1 are rendered active. Accordingly, current flows from one of bit lines BL1 and ZBL1 to memory cell 1 according to the data stored in memory cell 1. In response, the potential of one of data input/output lines IO and ZIO is reduced. Read circuit 35 compares the potentials between data input output lines IO and ZIO to output data of a logic corresponding to the comparison result.

The writing of data in storage nodes N1 and N2 into tunneling magneto-resistance elements 13 and 14 as well as reading out data in tunneling magneto-resistance elements 13 and 14 to storage nodes N1 and N2 have already been described in detail with reference to FIGS. 1 and 2. Therefore, description thereof will not be repeated here.

According to the present invention, the signals in storage nodes N1 and N2 are directly written into tunneling magneto-resistance elements 13 and 14 by driving write permit signal WE to an H level to render N channel MOS transistors 9–12 conductive. Therefore, the writing of signals in storage nodes N1 and N2 to tunneling magneto-resistance elements 13 and 14 can be conducted more rapidly than the conventional case where the signals in storage nodes N51 and N52 are read out to an external source via bit line pair BL and ZBL and then written into tunneling magneto-resistance elements 60 and 61 via a write circuit and a write bit line pair WBL, ZWBL.

Furthermore, the layout area can be reduced since it is not necessary to provide the write circuit and write bit line pair WBL, ZWBL required in conventional cases.

Figure 6:
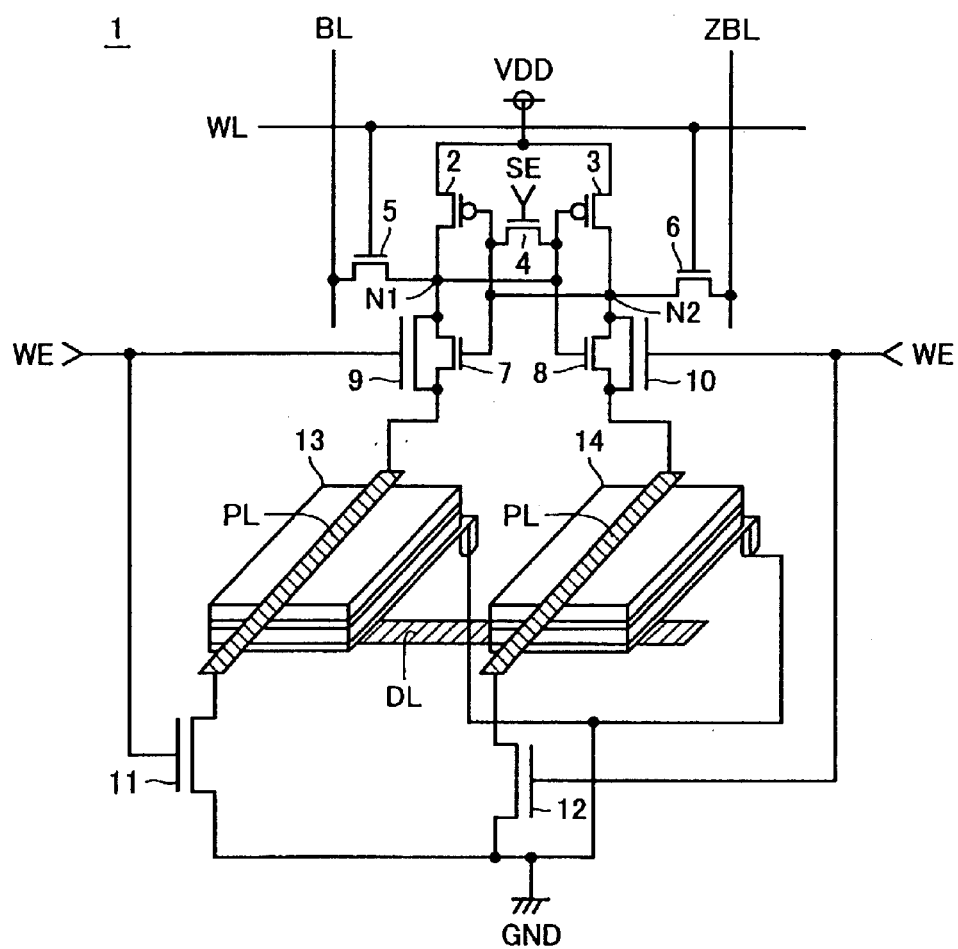
FIG. 6 is a circuit block diagram showing a modification of the embodiment.
Figure 7:
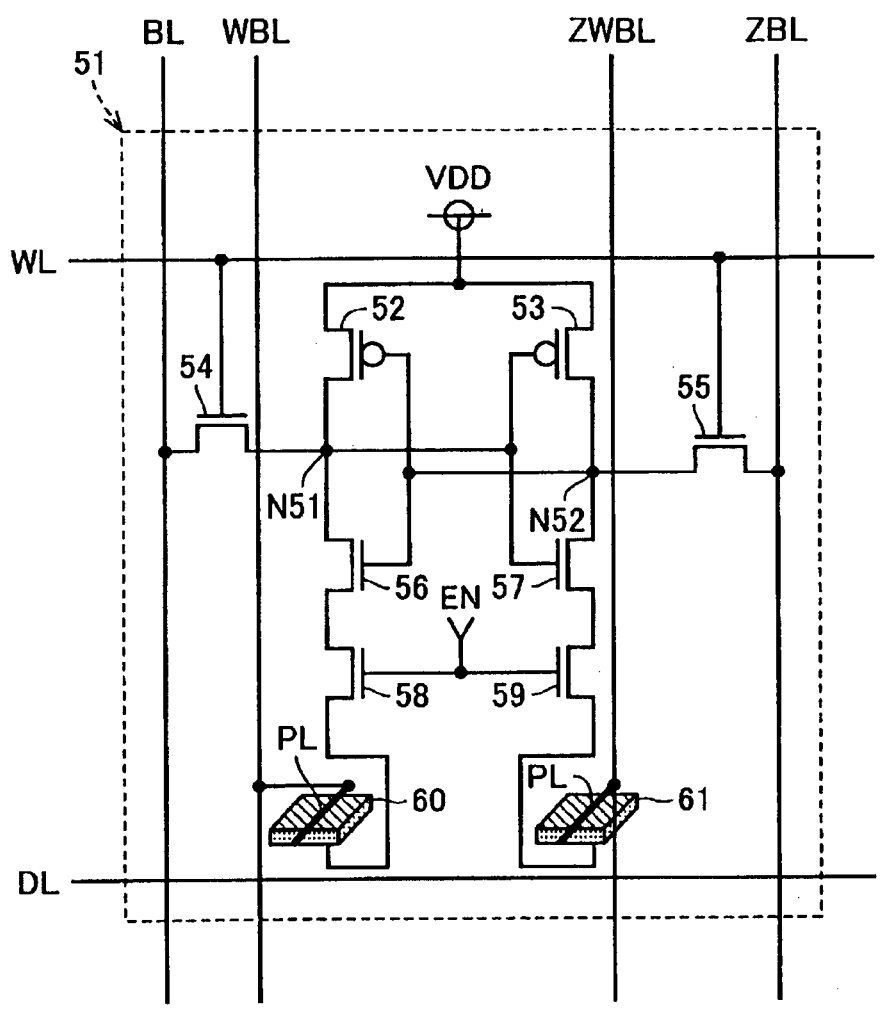
FIG. 7 is a circuit block diagram of a structure of a memory cell of a conventional MRAM.

FIG. 6 is directed to clarify the size difference in MOS transistors 2–12 of memory cell 1. The size of the symbol of each MOS transistor indicates the size, i.e., the current drivability, of that MOS transistor. The sizes of N channel MOS transistors 9–12 under control of signal WE are set larger than the sizes of other MOS transistors 2–8. This is because a large current must be conducted to N channel MOS transistors 9 and 11 or 10 and 12 when the magnetizing direction of free magnetic layer 18 of tunneling magneto-resistance elements 13 and 14 is to be altered. MOS transistors 2–8 may be set small since only the potentials of storage nodes N1 and N2 are to be retained. By optimizing the size of each of MOS transistors 2–12 corresponding to the function of that MOS transistor, a stable latch operation and write operation can be realized. Furthermore, the layout area of memory cell 1 can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

first and second magneto-resistance elements, each including a magnetic material film, and a program line and an electrode formed at a front face and a back face, respectively, of said magnetic material film, and having a resistance value between said program line and said electrode altered according to a current exceeding a predetermined threshold current being conducted to said program line, and storing a binary signal by the resistance value;

a first inverter driven by a power supply voltage applied via the program line and electrode of said second magneto-resistance element to provide an inverted signal of a signal applied to a first storage node to a second storage node;

a second inverter driven by said power supply voltage applied via the program line and electrode of said first magneto-resistance element to provide an inverted signal of a signal applied to said second storage node to said first storage node; and a first switch circuit connecting the program lines of said first and second magneto-resistance elements between said first and second storage nodes, respectively, and a line of a reference potential in response to a write permit signal permitting writing of signals in said first and second storage nodes to said first and second magneto-resistance elements.

2. The semiconductor memory device according to claim 1, wherein said first inverter comprises a first P type transistor connected between a line of power supply potential and said second storage node, and having its gate connected to said first storage node, and a first N type transistor connected between said second storage node and the program line of said second magneto-resistance element, and having its gate connected to said first storage node, wherein said second inverter comprises a second P type transistor connected between the line of said power supply potential and said first storage node, and having its gate connected to said second storage node, and a second N type transistor connected between said first storage node and the program line of said first magneto-resistance element, and having its gate connected to said second storage node, said first and second magneto-resistance elements having both their electrodes connected to a line of ground potential, said reference potential being said ground potential, wherein said first switch circuit comprises a third N type transistor connected between said first storage node and one end of the program line of said first magneto-resistance element, a fourth N type transistor connected between said second storage node and one end of the program line of said second magneto-resistance element, and fifth and sixth N type transistors connected between the other ends of the program lines of said first and second magneto-resistance elements, respectively, and the line of said ground potential, each of said third-sixth N type transistors being rendered conductive in response to said write permit signal, each of said third-sixth N type transistors having its current drivability set larger than a current drivability of each of said first and second N type transistors.

3. The semiconductor memory device according to claim 1, further comprising:

a transistor connected between said first and second storage nodes; and a read control circuit rendering said transistor conductive in response to said power supply voltage being applied, and then gradually raising a resistance value of said transistor to render said transistor nonconductive, and reading out signals stored in said first and second magneto-resistance elements to said first and second storage nodes.

4. The semiconductor memory device according to claim 3, further comprising:

a digit line extending close to the back face of said first and second magneto-resistance elements;

a write control circuit conducting a predetermined current to said digit line to form an auxiliary magnetic field when signals in said first and second storage nodes are to be written into said first and second magneto-resistance elements;

a word line;

a bit line pair including first and second bit lines; and a second switch circuit connecting said first storage node and said first bit line as well as said second storage node and said second bit line in response to said word line attaining a selected level;

said first magneto-resistance element, said second magneto-resistance element, said first inverter, said second inverter, said first switch circuit, said transistor, and said second switch circuit forming one memory cell, a plurality of memory cells being arranged in a plurality of rows and columns, a first signal line to transmit said write permit signal, a second signal line to transmit an output signal from said read control circuit, said digit line, and said word line being provided corresponding to each row, said bit line pair being provided corresponding to each column, said semiconductor memory device further comprising:

a row select circuit selecting any of said plurality of word lines according to a row address signal to render the selected word line to said selected level;

a column select circuit selecting any of said plurality of bit line pairs according to a column address signal; and a read/write circuit performing reading/writing of signals in said first and second storage nodes with respect to a memory cell corresponding to a word line selected by said row select circuit via a bit line pair selected by said column select circuit.

* * * * *